(12) United States Patent
Abe

(10) Patent No.: US 6,633,597 B1
(45) Date of Patent: Oct. 14, 2003

(54) SEMICONDUCTOR LASER AND METHOD FOR PRODUCING SAME

(75) Inventor: Hiroaki Abe, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/473,654

(22) Filed: Dec. 29, 1999

(30) Foreign Application Priority Data

Jan. 8, 1999 (JP) .......................................... P11-003039

(51) Int. Cl.$^7$ ................................................ H01S 5/00
(52) U.S. Cl. .......................................... 372/45; 372/46
(58) Field of Search ..................................... 372/43–46

(56) References Cited

U.S. PATENT DOCUMENTS

| | | | | |
|---|---|---|---|---|
| 4,229,070 A | * | 10/1980 | Olshansky et al. | 350/96.31 |
| 5,469,457 A | * | 11/1995 | Nagai et al. | 372/45 |
| 6,005,881 A | * | 12/1999 | Ikoma | 372/46 |
| 6,009,222 A | * | 12/1999 | Dong et al. | 385/127 |
| 6,011,810 A | * | 1/2000 | Haller et al. | 372/45 |

* cited by examiner

Primary Examiner—Paul Ip
Assistant Examiner—James Menefee
(74) Attorney, Agent, or Firm—Sonnenschein, Nath & Rosenthal

(57) ABSTRACT

A semiconductor laser enabling a higher output without lowering the performance of the laser such as its reliability, that is, a Fabry-Perot type semiconductor laser having, successively grown on a substrate, a first cladding layer of a first conductivity type, an active layer having at least one quantum well layer and at least two barrier layers, and a second cladding layer of a second conductivity type, a pair of facing end faces of said active layer constituting a resonator, wherein an impurity and holes due to the impurity are diffused in at least one region near the end faces of said active layer, and the quantum well layer and the barrier layers constituting said active layer are made mixed-crystals.

2 Claims, 6 Drawing Sheets

SEMICONDUCTOR LASER AND METHOD FOR PRODUCING SAME

BACKGROUND OF THE INVENTION

1. Field of the Invention

The present invention relates to a semiconductor laser and a method for producing the same, more particularly relates to a semiconductor laser constituted by a III-V group compound semiconductor such as GaAs and a method for producing the same.

2. Description of the Related Art

A semiconductor laser using an AlGaInP quaternary mix-crystal semiconductor on a GaAs substrate produces visual light of the 600 nm band and is used as a light source of an optical pick-up in a digital versatile disc (DVD) or other optical disc apparatus or of a laser pointer etc.

In such a semiconductor device, optical damage (hereinafter also referred to as COD (catastrophic optical damage)) occurs when the laser is operated while raising the output of the laser beam. It has been known that this is caused by the fact that the interfacial level in the regions near the end faces of a resonator of the semiconductor laser causes the bandgap at those regions near the end faces to become small.

For example, a method for realizing a higher output of a semiconductor laser by providing a window structure having a larger bandgap (energy width) than an oscillation wavelength of the semiconductor laser in the region near the optical output end faces of a resonator having a multiple quantum well structure and preventing the optical damage at this optical output end has been developed.

For example, Japanese Unexamined Patent Publication (Kokai) No. 7-58402 discloses a method of diffusing Zn in the regions near the end faces of the resonator of the semiconductor laser to scramble the multiple quantum well structure and thereby to expand the bandgap.

Further, for example Japanese Unexamined Patent Publication (Kokai) No. 10-200190 discloses a method in which holes are formed by introducing nitrogen into the regions near the end faces of the resonator of the semiconductor laser as an impurity by ion implantation, the holes are made to diffuse in the active region by annealing, and the quantum well structure is made a mixed-crystal one by the interaction between a well layer and barrier layers so as to expand the bandgap.

Summarizing the problems to be solved by the invention, in a semiconductor laser diffusing zinc in the regions near the end faces of the resonator, however, since the zinc easily diffuses, there is the problem that the zinc introduced in the active layer having the window structure diffuses to other layers, the light is absorbed by the diffused Zn, and therefore the performance of the laser is lowered.

Further, there is the problem that the leakage current of the regions near the end faces of the resonator increases due to the zinc and an oxidation reaction is accelerated by energy released at the time of non-light emitting recombination of carriers due to that leakage current, so the laser end face changes and the reliability is lowered.

On the other hand, in a semiconductor laser diffusing vacancies by introducing nitrogen into the regions near the end faces of the resonator by ion implantation, since the impurity atoms (N) do not diffuse up to the active region, the problems described do not occur, but there is a problem that since the ion radius of nitrogen is large, it is hard to implant the nitrogen and therefore an implantation energy of about 150 keV is required, the crystal is damaged at the time of this ion implantation, and therefore the reliability of the laser is lowered.

Further, there exists another problem in that, in the annealing after the ion implantation, a high temperature treatment of 850° C. is required. This temperature is near the crystal growth temperature of the semiconductor layer, so deterioration of the crystal layer occurs along with the annealing.

SUMMARY OF THE INVENTION

An object of the present invention is to provide a semiconductor laser enabling a higher output without lowering the performance of the laser such as its reliability and a method for producing the same.

To achieve this object, according to a first aspect of the present invention, there is provided a Fabry-Perot type semiconductor laser having, successively grown on a substrate, a first cladding layer of a first conductivity type, an active layer having at least one quantum well layer and at least two barrier layers, and a second cladding layer of a second conductivity type, a pair of facing end faces of said active layer constituting a resonator, wherein an impurity and vacancies due to the impurity are diffused in at least one region near the end faces of said active layer, and the quantum well layer and the barrier layers constituting said active layer are made mixed crystals.

In the semiconductor laser of the present invention, preferably boron is introduced as said impurity in at least one region near the end faces of said active layer. Further, preferably, in the regions near the pair of facing end faces of said active layer, the quantum well layer and the barrier layers constituting said active layer are made mixed-crystals. Further preferably, boron is introduced as said impurity in regions near the pair of facing end faces of said active layer.

In the semiconductor laser of the present invention, since the impurity and the vacancies due to the impurity are diffused in at least one region near the end faces of the active layer having at least one quantum well layer and at least two barrier layers and the quantum well layer and the barrier layers constituting the active layer are made mixed-crystals, it is possible to expand the bandgap of the regions near the end faces of the resonator of the semiconductor laser.

By using for example boron or another impurity, the impurity and the vacancies due to the impurity can be diffused, so it has become possible to use the effect of the impurity and the effect of the vacancies together. Namely, boron ions can be implanted into the semiconductor layer with a low implantation energy, and the diffusion of the impurity and the diffusion of the vacancies can be achieved at a low annealing temperature. Further, boron has a slower diffusion rate than that of zinc and another impurity used up to the present, so the diffusion of the impurity into the active layer can be adequately controlled.

For this reason, the problem of damage to the crystal layer at the time of ion implantation and at the time of a high annealing temperature, which has been a problem up to the present, or problems such as absorption of the light due to the impurity and an increase to the leakage current are suppressed, the bandgap of the regions near the end faces of the resonator of the semiconductor laser is expanded, and a higher output of the semiconductor laser is thereby enabled.

Further, to achieve the object, according to a second aspect of the present invention, there is provided a method of producing a Fabry-Perot type semiconductor laser in which a pair of facing end surfaces of an active layer constitute a resonator, comprising a step of forming a first cladding layer of a first conductivity type on a substrate, a step of forming an active layer having at least one quantum well layer and at least two barrier layers above said first cladding layer, a setup of forming a second cladding layer of a second conductivity type above said active layer, and a step of diffusing an impurity and vacancies due to the impurity in said active layer in predetermined regions acting as end faces constituting said resonator and making the quantum well layer and the barrier layers constituting said active layer mixed-crystals.

In the method for producing a semiconductor laser of the present invention, the first cladding layer of the first conductivity type is formed on the substrate, the active layer having at least one quantum well layer and at least two barrier layers is formed above the first cladding layer, and the second cladding layer of the second conductivity type is formed above the active layer. Next, the impurity and the vacancies due to the impurity are diffused in the active layer in predetermined regions acting as end faces constituting the resonator of the semiconductor layer and the quantum well layer and the barrier layers constituting the active layer are made mixed-crystals.

In the method for producing a semiconductor laser of the present invention, preferably the step of diffusing the impurity and the vacancies due to the impurity in said active layer in the predetermined regions acting as end faces constituting said resonator includes a step of introducing said impurity in predetermined regions acting as the end faces constituting said resonator and a heat treatment step for diffusing said impurity and the vacancies due to the impurity in said active layer in said predetermined regions.

In the method for producing the semiconductor laser of the present invention, preferably boron is used as said impurity. Further, said heat treatment step is preferably carried out at a temperature not more than the crystal growth temperature of the semiconductor layer and more preferably is carried out at a temperature of 750° C. or less.

According to the method for producing a semiconductor laser of the present invention, since boron or another impurity and the vacancies due to the impurity are diffused in the active layer in the predetermined regions acting as end faces constituting the resonator of the semiconductor laser and the quantum well layer and the barrier layers constituting the active layer are made mixed-crystals, it is possible to implant the boron ions into the semiconductor layer with a low implantation energy and it is possible to effect the diffusion of the impurity and the diffusion of vacancies at a low annealing temperature not more than the crystal growth temperature of the semiconductor layer, for example 750° C. or less. Further, since boron has a slower diffusion rate than that of zinc and other impurities used up to the present, the diffusion of the impurity into the active layer can be adequately controlled.

Accordingly, the problem such as the damage to the crystal layer at the time of ion implantation and at the time of a high annealing temperature or problems such as the absorption of the light due to the impurity and the increase of the leakage current are suppressed, the bandgap of the regions near the end faces of the resonator of the semiconductor laser is expanded, and therefore a higher output of the semiconductor laser is enabled.

BRIEF DESCRIPTION OF THE DRAWINGS

These and other objects and features of the present invention will become clearer from the following description of the preferred embodiments given with reference to the attached drawings, in which:

FIGS. 2A and 2B are sectional views of steps in the method for producing a semiconductor laser according to the present invention, in which FIG. 2A shows the state up to the step of forming a p-type contact layer and FIG. 2B shows the state up to the step of forming a mesa-shape;

FIGS. 4A and 4B show steps after FIG. 3B, in which FIG. 4A shows the state up to the step of introducing the impurity into the predetermined regions acting as end faces constituting the resonator of the semiconductor laser and FIG. 4B shows the state up to the annealing step for diffusing the impurity and the vacancies due to this impurity into the active layer of the predetermined regions acting as end faces constituting the resonator of the semiconductor laser;

FIGS. 5A and 5B show steps after FIG. 4B, in which FIG. 5A shows the state up to the step of removing a protection layer and FIG. 5B shows the state up to a cleaving step;

DESCRIPTION OF THE PREFERRED EMBODIMENTS

Figure 1A:
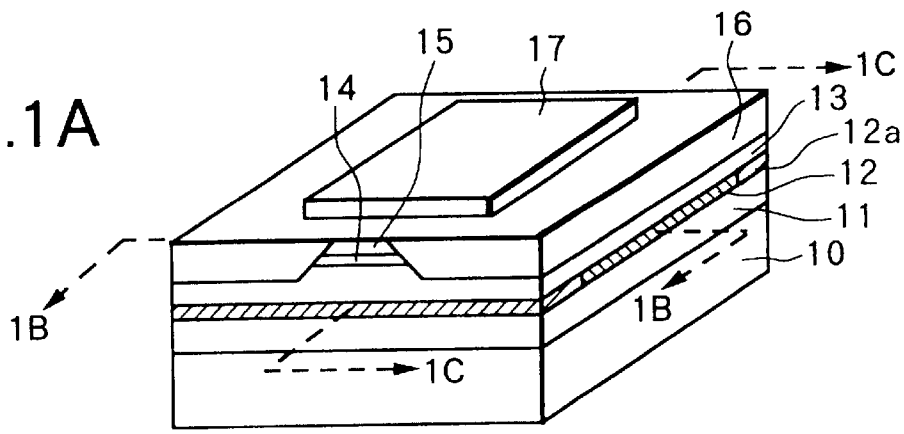
FIG. 1A is a perspective view of a semiconductor laser according to the present invention.
Figure 1B:
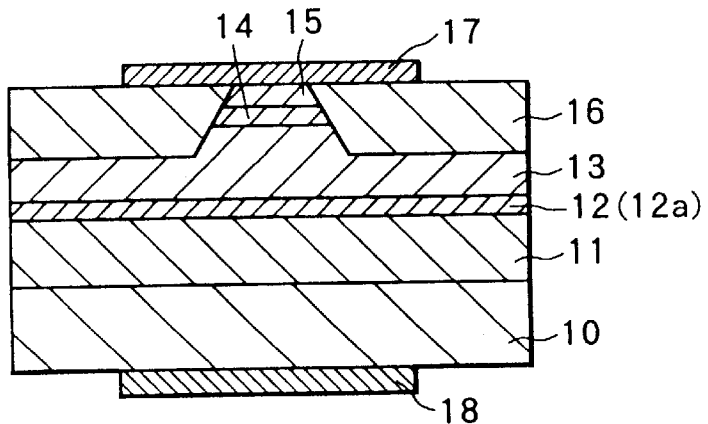
FIG. 1B is a sectional view taken along line 1B–1B in FIG. 1A.
Figure 1C:
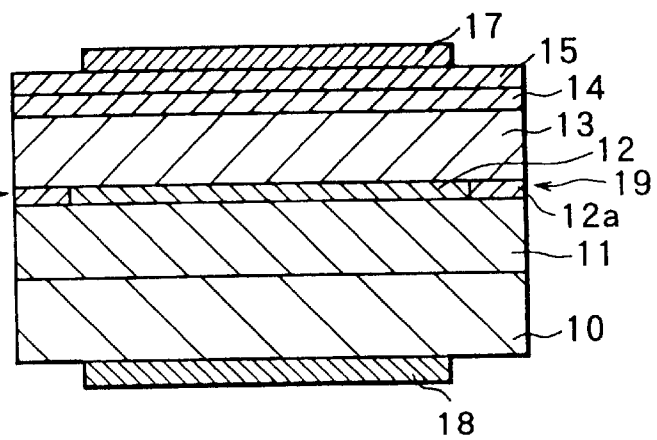
FIG. 1C is a sectional view taken along line 1C–1C in FIG. 1A.

FIG. 1A is a perspective view of a semiconductor laser according to an embodiment of the present invention, FIG. 1B is a sectional view taken along the line 1B–1B in FIG. 1A, and FIG. 1C is a sectional view taken along the line 1C–1C in FIG. 1A.

Note that, the semiconductor laser of the present embodiment is constituted by an AlGaInP-based material.

As shown in FIGS. 1A to 1C, this semiconductor laser has for example the following structure.

For example, on a substrate 10 made of GaAs, an n-type cladding layer 11 made of AlGaInP, an active layer 12 comprising a layer obtained by alternately stacking a GaInP layer and a AlGaInP layer, a p-type second cladding layer 13 made of AlGaInP, a p-type intermediate layer 14 made of GaInP, and a p-type contact layer 15 made of GaAs are stacked.

Further, a p-type electrode 17 is formed connected to the p-type contact layer 15, and an n-type electrode 18 is formed connected to the substrate 10.

In the above structure, by applying predetermined voltages to the p-type electrode 17 and the n-type electrode 18 and injecting the carriers, radioactive recombination occurs in the active layer 12 to emit light. The pair of facing end faces 19 of the active layer 12 constitute a resonator, light amplification by induction emission is carried out, and thereby a Fabry-Perot type semiconductor laser emitting laser light is constituted.

In the region of the stacked layer up to the p-type contact layer 15 formed on the substrate 10 except the current injection region, the n-type region 16 is formed from the surface of the p-type contact layer 15 to a depth in the middle of the p-type second cladding layer 13. Thus, a stripe which becomes a loss guide type current reducing structure is formed.

In the above structure, boron or another impurity and holes due to the boron are diffused in the regions 12a near the pair of facing end faces 19 of the active layer 12 and the quantum well layer and the barrier layers constituting the active layer are made mixed-crystals. By this, the bandgap of the regions near the end faces of the resonator of the semiconductor laser can be expanded, and a higher output of the semiconductor laser is enabled.

As the impurity, boron or another impurity and vacancies due to the impurity can be diffused. Namely, it is possible to use the effect of the impurity and the effect of the holes together.

For this reason, boron ions can be implanted into the semiconductor layer with a low implantation energy, and the diffusion of the impurity and the diffusion of the vacancies can be carried out at a low annealing temperature. Further, boron has a slower diffusion rate than that of zinc and other impurities used up to the present, so the diffusion of the impurity into the active layer can be adequately controlled. Accordingly, it is possible to suppress the problem such as damage to the crystal layer at the time of ion implantation and at a high annealing temperature, which has been a problem up to the present, or problems such as the absorption of the light due to the impurity and the increase in the leakage current.

Next, an explanation will be made of the method for producing the semiconductor laser.

First, the explanation will be made with reference to the sectional view taken along the line 1B–1B of FIG. 1A.

Figure 2A:
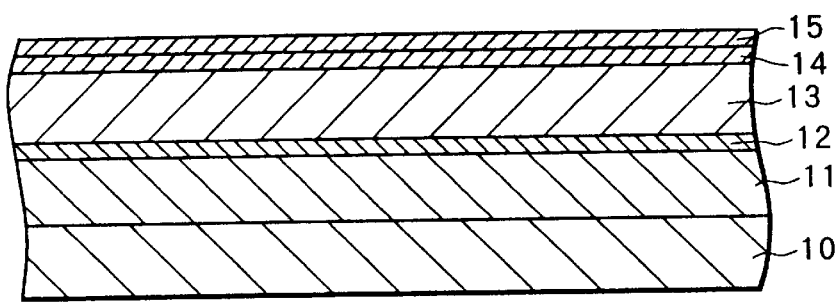

As shown in FIG. 2A, on a substrate 10 made of GaAs, an AlGaInP layer is grown by for example a metal organic chemical vapor deposition process (hereinafter, also referred to as an MOCVD process) to form an n-type first cladding layer 11. Above this, a GaInP layer and AlGaInP layer are alternately stacked to form an active layer 12 of a multiple quantum well structure. Above this, an AlGaInP layer is grown to form the p-type second cladding layer 13. Above this, a GaInP layer is grown to form a p-type intermediate layer 14. Above this, GaAs is grown to form a p-type contact layer 15.

Figure 2B:
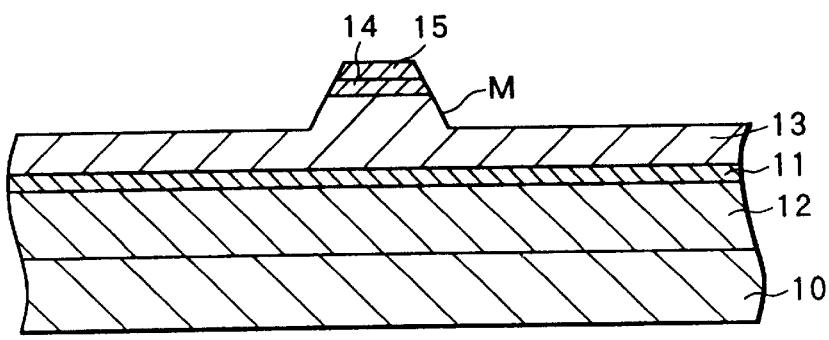

Next, as shown in FIG. 2B, a current injection region having a width of for example 4 µm is protected by a resist film (not illustrated). For example, sulfuric acid-based wet etching is applied to etch from the surface of the p-type contact layer 15 to a depth in the middle of the p-type second cladding layer 13 in the region except the current injection region so as to form the mesa-shape M.

Figure 3A:
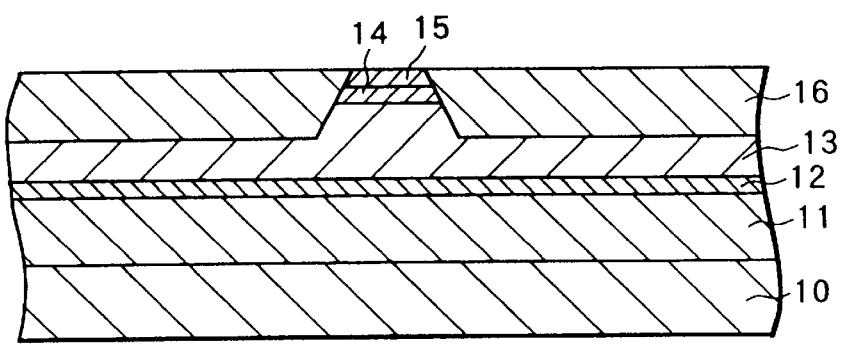
FIGS. 3A and 3B show the state up to the step of forming an n-type region as steps after FIG. 2B, in which FIG. 3A corresponds to the sectional view taken along line 1B–1B in FIG. 1A and FIG. 3B corresponds to the sectional view taken along the line 1C–1C in FIG. 1A.

Next, as shown in FIG. 3A, the MOCVD process is used to grow an n-type GaAs layer on the etched part to form the n-type region 16. A stripe which becomes the loss guide type current reducing structure is formed by this.

Figure 3B:
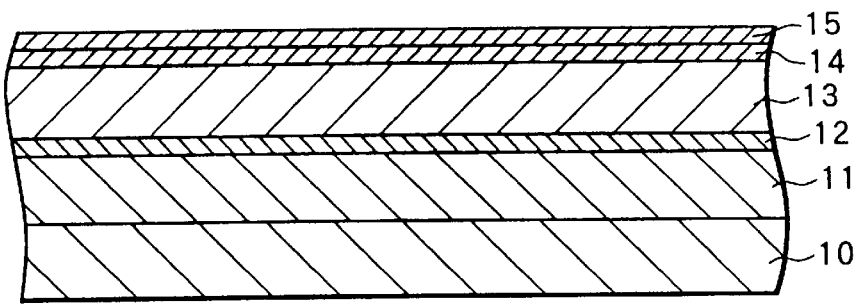

Here, in FIG. 3B is a sectional view of the structure shown in FIG. 3A along the line 1C–1C of FIG. 1A. The steps from here will be explained by this sectional view taken along the line 1C–1C.

Figure 4A:
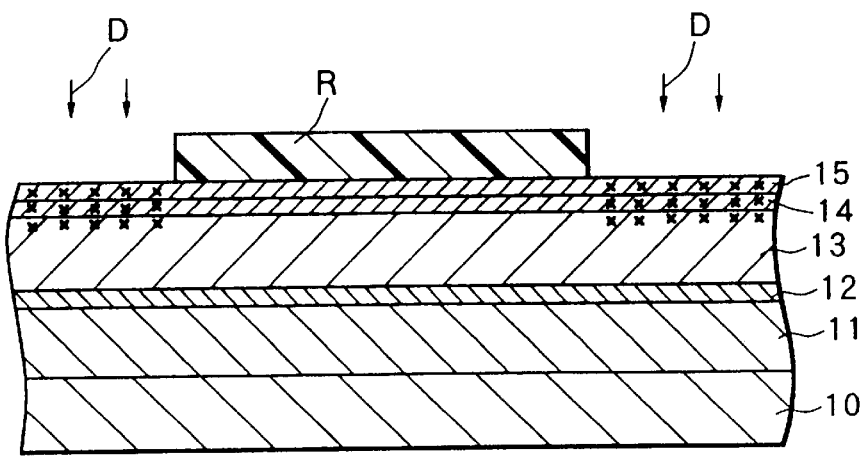

Next, as shown in FIG. 4A, a resist film R is formed by patterning by a photolithography step, and an impurity D2 such as boron is introduced in the predetermined regions acting as the end faces constituting the resonator of the semiconductor laser under ion implantation conditions of, for example, an implantation energy of 80 keV and a dosage of $2.8 \times 10^{14}$ atoms/cm$^2$. In the figure, parts into which the boron or other impurity ions are introduced are indicated by the x marks.

Figure 4B:
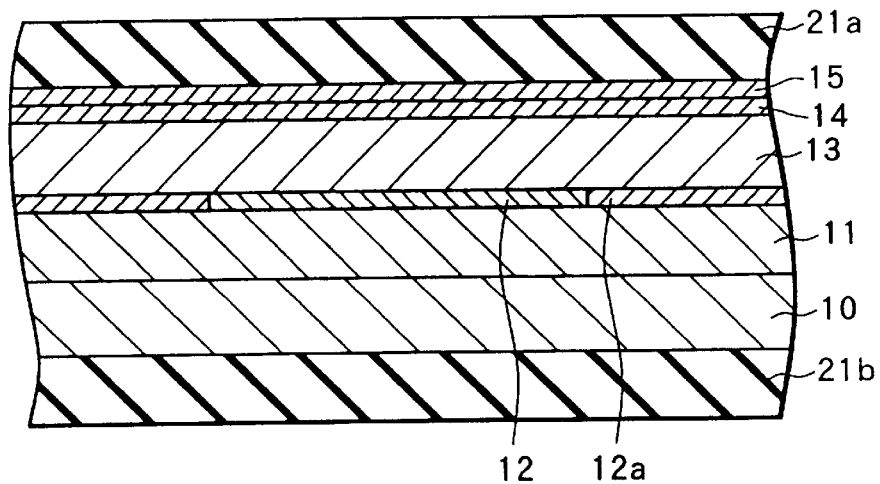

Next, as shown in FIG. 4B, in order to prevent arsenic loss As in the annealing, cover films 21a and 21b comprised by silicon oxide are formed on the two surfaces of the substrate 10 by for example a plasma CVD process.

Next, annealing is applied for one minute at a temperature of for example 650° C. This annealing is carried out at a low annealing temperature of 750° C. or less, which is a temperature less than the crystal growth temperature of the semiconductor layer, in order to prevent the deterioration of the semiconductor layer. By this annealing, the boron and the vacancies due to the boron are diffused in the active layer 12a in the predetermined regions acting as the end faces constituting the resonator and the quantum well layer and the barrier layers constituting the active layer 12 are made mixed-crystals.

Figure 5A:
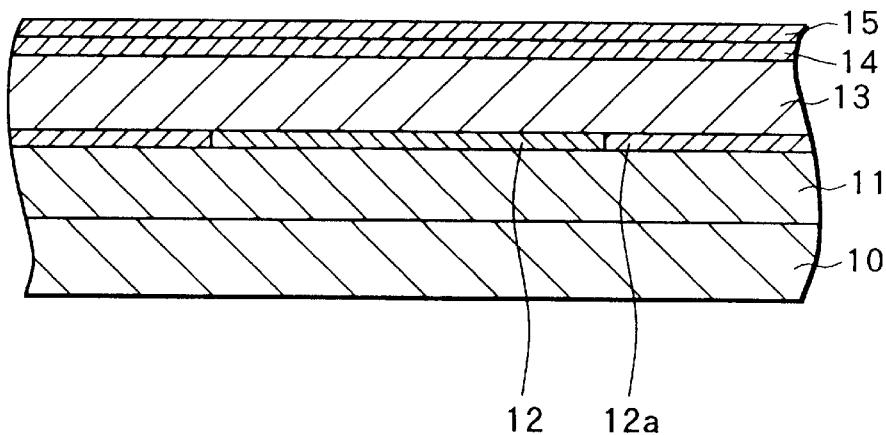

Next, as shown in FIG. 5A, by wet etching, for example, fluoric acid-based etching or dry etching by reactive ion etching (RIE) or the like, the cover films 21a and 21b comprised of the silicon oxide are removed.

Figure 5B:
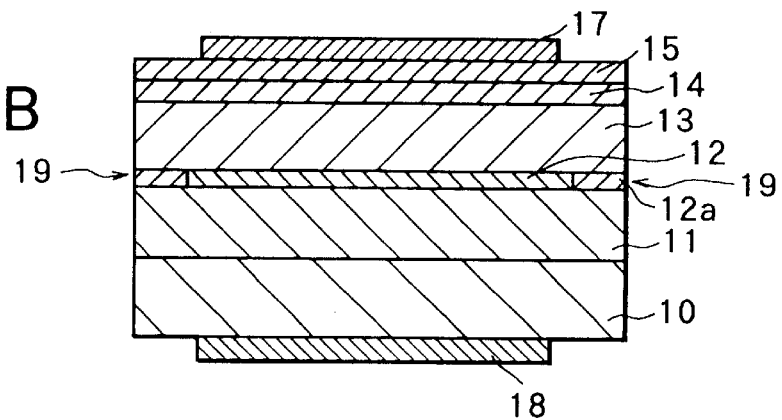

Next, as shown in FIG. 5B, a vacuum deposition process is used to form the p-type electrode 17 connected to the p-type contact layer 15 and further to form the n-type electrode 18 connected to the substrate 10.

Next, a cleavage process is used to cleave the active layer 12a in the region in which the quantum well layer and the barrier layers are made mixed-crystals so that the resonator length becomes 500 µm and thereby to form the end faces 19 constituting the resonator. As the following steps, a dielectric film having a reflectivity of 30% is formed on the front surfaces of the end faces 19 constituting the resonator, and a dielectric film having a reflectivity of 75% is formed on their rear surface.

The semiconductor layer shown in FIGS. 1A to 1C can therefore be formed.

According to the method for producing a semiconductor laser of the present embodiment, since the boron or another impurity and the vacancies due to the related impurity are diffused in the active layer in predetermined regions acting as the end faces constituting the resonator of the semiconductor laser and the quantum well layer and the barrier layers constituting the active layer are made mixed-crystals, the boron can be injected into the semiconductor layer with a low implantation energy and the diffusion of the impurity and the diffusion of the vacancies can be achieved at a low annealing temperature of for example 750° C. or less. Further, since boron has a slower diffusion rate that that of zinc and other impurities used up to the present, the diffusion of the impurity into the active layer can be adequately controlled.

Accordingly, the problem of damage to the crystal layer at the time of ion implantation and at a high annealing temperature or problems such as the light absorption due to the impurity and the increase in the leakage current can be suppressed, the bandgap of the regions near the end faces of the resonator of the semiconductor laser can be expanded, and thereby a higher output of the semiconductor laser is enabled.

EXAMPLES

Preparation of Sample A (Present Invention)

As shown in FIG. 2A, on a substrate 10 made of GaAs, the MOCVD process was used to form an n-type first cladding layer 11 made of an AlGaInP layer, an active layer 12 having a multiple quantum well structure formed by alternately stacking a GaInP layer and an AlGaInP layer, a p-type second cladding layer 13 made of an AlGaInP layer, a p-type intermediate layer 14 made of GaInP, and a p-type contact layer 15 made of GaAs.

Next, as shown in FIG. 2B, a mesa-shape M acting as the current injection region of 4 μm width was formed. Next, as shown in FIG. 3C, an n-type region 16 made of an n-type GaAs layer was formed by the MOCVD process. Thus, a loss guide type current reducing structure was formed.

Next, as shown in FIG. 4A, using a resist film R as a mask, an impurity (boron) D was introduced under conditions of an implantation energy of 80 keV and a dosage of $8 \times 10^{14}$ atoms/cm$^2$, the cover films 21a and 21b were formed as shown in FIG. 4B, and then annealing of one minute was applied at a temperature of 680° C. to diffuse the boron and vacancies due to the boron and thereby make the quantum well layer and the barrier layers in the active layer 12a in the predetermined regions acting as the end faces constituting the resonator mixed-crystals.

Next, as shown in FIG. 5A, the cover layers 21a and 21b were removed, then, as shown in FIG. 5B, a p-type electrode 17 and n-type electrode 18 were formed. The cleavage method was used to cleave the active layer 12a in the region in which the quantum well layer and the barrier layers were made mixed-crystals so that the resonator length became 500 μm and thus form the end faces 19 constituting the resonator. Further, a dielectric film having a reflectivity of 30% was formed on the front surfaces of the end faces 19 constituting the resonator and a dielectric film having a reflectivity of 75% was formed on their rear surfaces to finish preparing the sample A.

As described above, by making the quantum well layer and the barrier layers in the active layer 12a in the predetermined regions acting as the end faces constituting the resonator mixed-crystals, the energy width of the active layer can be expanded.

Figure 6:
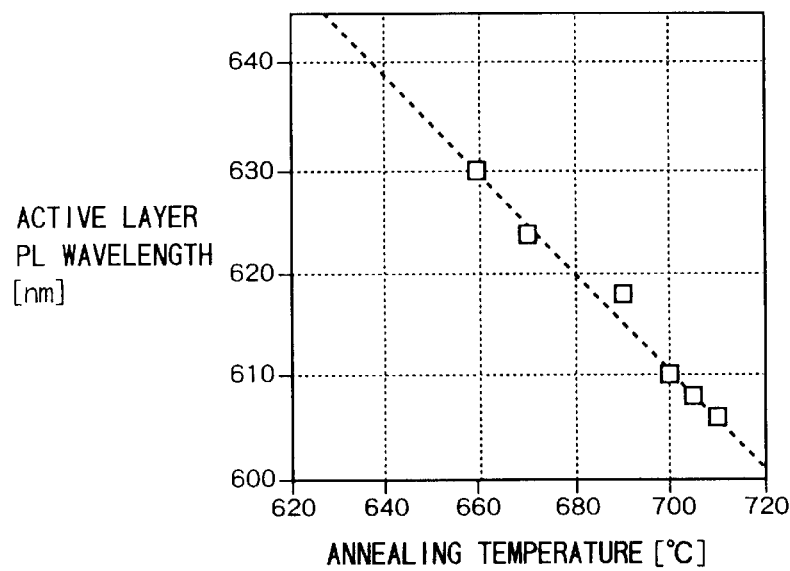
FIG. 6 is a view of a PL wavelength dependency of the active layer according to an embodiment with respect to the annealing temperature for the PL wavelength adjustment.

FIG. 6 is a view of the PL wavelength dependency with respect to the annealing temperature for the PL wavelength adjustment of the active layer. By changing the annealing temperature in this way, it is possible to change the PL wavelength. In the case of a PL wavelength of 645 nm, which is the active layer energy width after the crystal growth, the PL wavelength becomes 605 nm at an annealing temperature of 710° C., that is, the wavelength becomes shorter by 40 nm.

Further, when the annealing was applied at a temperature of 750° C. or more, the PL light intensity was lowered and deterioration of the active layer was observed.

Preparation of Sample B (Related Art)

A sample was prepared different from the sample A in only the points that boron ions were not implanted into the predetermined regions acting as the end faces constituting the resonator and the quantum well layer and the barrier layers in the active layer were not made mixed-crystals. This was designated as the sample B.

Measurement of Optical Output Level at Which Optical Damage Occurs

The optical output levels at which optical damage occurs (COD levels) were measured for semiconductor lasers of the samples A and B formed as described above by an operating current of 150 to 175 mA.

Figure 7:
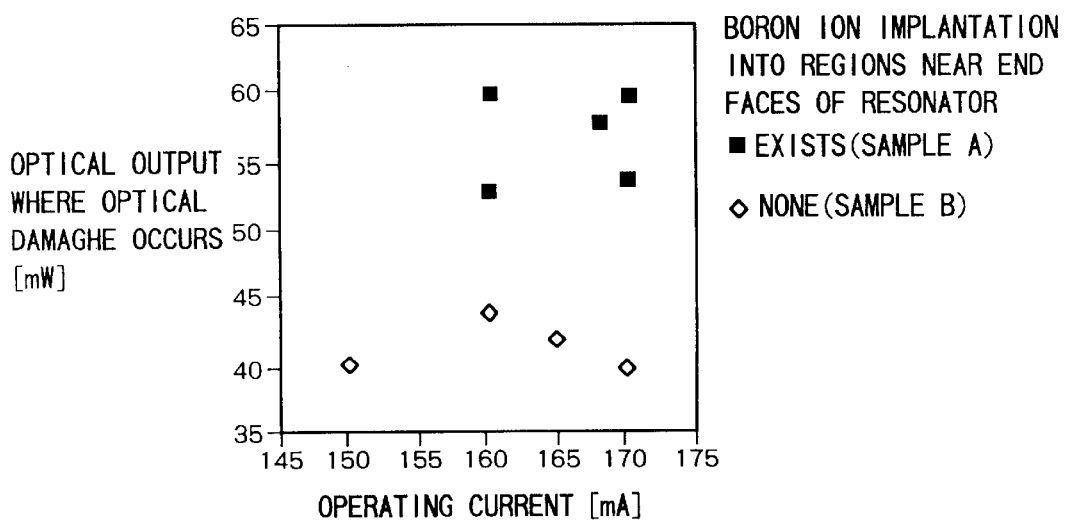
FIG. 7 is a view of the difference of optical output levels at which optical damage is suffered with respect to existence of the introduction of an impurity into predetermined regions acting as end faces constituting the resonator according to the embodiment.

As shown in FIG. 7, in contrast to the fact that the COD level in the sample B according to the related art was about 40 mW, it was confirmed that the COD level of the sample A according to the present invention was 55 to 60 mW, that is, that it had become possible to raise the output by about 50% with respect to the related art.

Operation Time Test

Further, the sample A according to the present invention could operate for 5000 hours or more at an optical output of 30 mW and an ambient temperature of 60° C., so a high reliability was obtained.

While the invention has been described with reference to specific embodiment chosen for purpose of illustration, it should be apparent that numerous modifications could be made thereto by those skilled in the art without departing from the basic concept and scope of the invention.

For example, the n-type and the p-type conductivities of the cladding layers formed on and under the active layer may be arranged in any way. Further, it is possible to appropriately form buffer layers. Further, it is also possible to adopt a double hetero structure of forming the cladding layers at both sides of the active layer.

As the material constituting the semiconductor laser, it is also possible to use materials other than AlGaInP.

Other than this, a variety of modifications are possible within the range not out of the gist of the present invention.

Summarizing the effects of the present invention, as explained above, according to the semiconductor laser of the present invention, a higher output is made possible without lowering the reliability and other aspects of the performance of the laser.

Further, according to the method for producing a semiconductor laser of the present invention, the semiconductor laser of the present invention can be easily produced, and it becomes possible to produce a semiconductor laser enabling higher output without lowering the reliability and other aspects of the performance of the laser.

What is claimed is:

1. A Fabry-Perot type semiconductor laser having, successively grown on a substrate, a first cladding layer of a first conductivity type, an active layer having at least one quantum well layer and at least two barrier layers, and a second cladding layer of a second conductivity type, a pair of facing end faces of said active layer constituting a resonator, wherein:

an impurity comprising boron is introduced into the second cladding layer at an implantation energy of 80 keV and the impurity and vacancies due to the impurity are diffused from the second cladding layer in at least one region of said active layer near the end faces of said active layer, and the quantum well layer and the barrier layers constituting said active layer are made mixed-crystals by the diffused impurity and vacancies due to the impurity.

2. A semiconductor laser as set forth in claim 1, wherein, in the regions near the pair of facing end faces of said active layer, the quantum well layer and the barrier layers constituting said active layer are made mixed-crystals.

* * * * *